United States Patent [19]

Barton et al.

[11] Patent Number: 4,596,757

[45] Date of Patent: Jun. 24, 1986

[54] PHOTOPOLYMERIZABLE DUAL TRANSFER NEGATIVE WORKING COLOR PROOFING SYSTEM

[75] Inventors: Oliver A. Barton, Florham Park; James D. Wright, Basking Ridge, both of N.J.

[73] Assignee: American Hoechst Corporation, Somerville, N.J.

[21] Appl. No.: 720,468

[22] Filed: Apr. 5, 1985

[51] Int. Cl.[4] .......................... G03C 1/90; G03F 7/10; G03F 3/00
[52] U.S. Cl. .................................... 430/257; 430/258; 430/259; 430/262
[58] Field of Search ............... 430/257, 256, 259, 293, 430/258

[56] References Cited

U.S. PATENT DOCUMENTS

| | | |
|---|---|---|
| 3,671,236 | 6/1972 | Van Beusekom .................... 430/257 |
| 3,721,557 | 3/1973 | Inoue ..................................... 430/257 |
| 4,530,896 | 7/1985 | Christensen et al. ................ 430/259 |

Primary Examiner—Richard L. Schilling
Attorney, Agent, or Firm—Richard S. Roberts

[57] ABSTRACT

This invention relates to photosensitized sheet constructions which, upon exposure to an actinic radiation source through a screened image, can accurately reproduce said image. The construction is useful as a color proofing film which can be employed to accurately predict the image quality from a lithographic printing process. This system allows the operator to use either a full layer transfer or an image transfer method of color proofing.

17 Claims, No Drawings

PHOTOPOLYMERIZABLE DUAL TRANSFER NEGATIVE WORKING COLOR PROOFING SYSTEM

BACKGROUND OF THE INVENTION

In the graphic arts, it is desirable to produce a four or more color proof to assist a color etcher in correcting a set of color prints prior to using them to produce color plates and also to reproduce the color quality that will be obtained during the printing process. The proof must be a consistent duplication of the half tone, and should neither gain nor lose color. Visual examination of a color proof should show the following characteristics:
 1. Defects on the negative.
 2. The best color rendition to be expected from press printing of the material.
 3. The correct gradation of all colors and whether grays are neutral.
 4. The need, if any, for subduing one of the colors and/or giving directions for altering the film negatives before making the printing plates.

Color proofing sheets, for multi-colored printing, have heretofore been made by using a printing press or a proof press while taking all the steps necessary for actual multicolor printing, but such a conventional method of color proofing has been costly and time consuming.

Photographic processes have also been used, especially photographic processes using photopolymers. There are two known types of photographic color proofing methods; namely, the surprint type and the overlay type.

In the overlay type of color proofing method, an independent transparent plastic support is used for producing a print of each color separation film by applying a photosensitive solution of the corresponding color. A plurality of such supports carrying prints of corresponding colors are then superposed upon each other on a white sheet to produce a color proofing sheet. The overlay type of color proofing method has the disadvantage that the superposed plastic supports tend to darken the color proofing sheet, and, as a result, the impression of the color proofing sheet thus prepared becomes vastly different from copies actually obtained by a conventional printing press or a proof press. Its primary advantage is that it is quick and can serve as a progressive proof by combining any two or three colors in register.

In the surprint type of color proofing method, a color proofing sheet is prepared by successively producing prints of different colors from different color separation films, respectively, by utilizing a single opaque support by applying toners, or by applying photosensitive solutions or coatings of photopolymers of corresponding colors on the opaque support in succession. Examples of some of these approaches are U.S. Pat. No. 3,671,236 and U.S. Pat. No. 3,136,637. An advantage of the surprint type of color proof is that the color saturation is not influenced by the plastic support. This method more closely resembles the actual printing process and eliminates the color distortion inherent in the overlay system.

Various processes for producing copies of an image embodying photopolymerization and thermal transfer techniques are known. See U.S. Pat. Nos. 3,060,023; 3,060,024; 3,060,025; 3,481,736; and 3,607,264. In these processes, a photopolymerizable layer coated on a suitable support is imagewise exposed to a process transparency. The surface of the exposed layer is then pressed into contact with the image receptive surface of a separate element and at least one of the said elements is heated to a temperature above the transfer temperature of the unexposed portions of the layer. The two elements are then separated, whereby the thermally transferrable, unexposed, image areas of the composite transfer to the image receptive element. If the element is not precolored, the tacky unexposed image may now be selectively colored with a desired toner. The colored matter preferentially adheres to the clear unpolymerized material. The lamination, exposure, and development steps are carried out for the respective colors in sequence thus making this process time consuming.

U.S. Pat. No. 3,574,049 provides a transfer process for printing a design on a final support which comprises (a) printing a design onto a temporary support, (b) superimposing the temporary support and the final support, (c) applying heat and/or pressure to the superimposed structure formed in (b), and (d) separating the temporary support from the final support which retains the printed design, the affinity of the matter of the design for the temporary support being lower than its affinity for the final support.

In U.S. Pat. No. 3,721,557 a method of transferring colored images is claimed which provides a stripping layer coated between the photosensitive element and the support. When the photosensitive layer is exposed to actinic light and developed, the more soluble portions are selectively removed to produce a visible image. The image-carrying support is pressed against a suitable adhesive coated receptor member and subsequently, the carrier support sheet is stripped to accomplish the transfer of the image. A fresh layer of adhesive is applied to the receptor for each subsequent transfer.

SUMMARY OF THE INVENTION

In general, this invention provides an image reproduction and transfer process in which an element is produced comprising, in order (a) a carrier support, (b) a release layer (c) a colored photopolymerizable layer, and (d) an adhesive.

The invention allows the operator to choose proofing either by successively transferring the adhesive and full colored photopolymer layers to a receptor sheet and subsequently exposing and developing the image; or alternatively exposing and developing each individual color and transferring individual colored images to a receptor to form a composite proof.

The invention provides a method for producing a multi-colored proofing member which comprises:
 (a) providing a colored photographic element which comprises a substrate having sequentially disposed thereon a release layer, a colored, photopolymerizable, photosensitive layer and an adhesive layer; said element being capable of alternatively undergoing each of the functions (1) and (2) below; and
 (b) performing either function 1 or function 2:
  (1) laminating said element to a receptor sheet by transferring said adhesive, colored photosensitive and release layers to one side of said receptor sheet, and peeling off said substrate; imagewise exposing said colored layer to actinic radiation; removing said release layer and the unexposed areas of said colored photosensitive layer with a wet developer and leaving a colored image disposed on said receptor sheet; and repeating the foregoing steps of function (1) for at least one different colored photographic element wherein each of said different colored images is carried on the same side of said receptor sheet;

(2) exposing said colored photosensitive layer to actinic radiation; laminating said element to a temporary receiving sheet by transferring said adhesive, colored photosensitive and release layers to one side of said temporary receiving sheet and peeling off said substrate; removing substantially all of said release layer and the unexposed areas of said colored layer with a wet developer while leaving a colored image disposed on said temporary receiving sheet and laminating said adhesive layer and said colored image to a receptor sheet and peeling off said temporary receiving sheet; and repeating the foregoing steps of function (2) for at least one different colored photographic element wherein each of said different colored images is carried on the same side of said receptor sheet.

DETAILED DESCRIPTION OF THE PREFERRED EMBODIMENT

In the usual full color proofing guide, four distinct colored images are formed, namely magenta, cyan, yellow and black. When the images are superimposed upon each other, a simulated full color reproduction results. As hereinbefore described, one begins the process of the present invention by preparing a photographic element which has a substrate and sequentially carried thereon three layers which are a release layer, a colored photohardenable layer and an adhesive layer. The process is unique in that the operator has a choice of two image formation methods using the same composite photographic element.

These choices are full colored layer transfer with subsequent sequential image formation, and individual image formation with image only superimposition.

1. If an image only transfer is desired, the operator may expose the composite through a negative flat placed in contact, emulsion to adhesive. The resulting latent image film is then transferred to a temporary receiving sheet, which is preferably a polyester film, before developing the image with the developer solution. Each color in the four color transfer process is likewise exposed and transferred to its own polyester sheet and the image developed. As a last step, the image may be transferred in register to give a right reading image.

2. If a full solid color layer transfer is preferred, a first coated composite is transferred to a permanent base and is then exposed with subsequent development of the image. This is a sequential color transfer process and each of the subsequent colors must be transferred on top of the previous color, exposed in register and developed to obtain the full four color proof.

The image transfer procedure allows visual inspection of the individual images before final transfer and thus allows the operator to replace one or more defective images. On the other hand the solid color transfer procedure provides a one-step right reading image.

In the preferred embodiment, the substrate, receptor sheet and the temporary receiving sheet may be composed of any suitable flexible sheet material and is preferred to be transparent. It should also preferably be dimensionally stable when undergoing the herein specified treatment processes. That is, they should preferably be substantially unaffected by the developing solutions and should have substantially no change in dimensions under heating in the range of from about 135° F. to about 165° F. Suitable sheet materials non-exclusively include the following compositions and combinations thereof: glass, metals, for example, aluminum sheets, paper, silicon, and films or sheets comprised of: acrylonitrile-butadiene-styrene terpolymers (ABS) cellulose acetate, cellulose triacetate, cellulose acetate butyrate, cellulose propionate, polybutylene, polybutadiene, polycarbonate, polyester, polyethersulfone, polyethylene (low, medium and high density), ethylene-propylene copolymers, ethylene vinyl acetate copolymers, nylons (polyamides), acrylonitrile copolymers, ionomers, polyimides, polymethylmethacrylates, polychlorotrifluoroethylenes, fluoronated ethylene propylene copolymers, perfluoroalkoxy resins, ethylenechlorotrifluoroethylene copolymers, ethylene-tetrafluoroethylene copolymers, polyvinyl fluoride resins, polyvinylidene fluoride resins, polypropylenes, polystyrene (and oriented polystyrene), polyurethane elastomers, polyvinyl chloride-plasticized, polyvinyl chloride-unplasticized, polyvinyl chloride copolymer resins, polyvinylidene chloride and its copolymers, polyvinyl acetate, polyvinyl alcohol.

Transparent polyethylene terephthalate having a thickness of about 3 mils is the most preferred material for these sheets.

The release layer is the first coat onto the substrate. Its purpose is to ensure easy release when the entire coating composite is transferred to the permanent carrier and/or the temporary receiver sheet.

The preferred release layers are formed by coating an aqueous solution of a water soluble polymer onto the substrate and evaporating off the coating solvents. Preferred water soluble polymers non-exclusively include polyvinyl alcohol, polyvinyl pyrrolidone, hydroxy propyl cellulose, methyl cellulose, ethyl cellulose, hydroxy ethyl cellulose, ethyl hydroxy ethyl cellulose, gelatin, gum arabic and polyvinyl ether/maleic anhydride polymers. Coating solvents non-exclusively include water and alcohols.

The purpose of the release layer is to release the subsequently applied layers smoothly i.e., without stick or slip, from the substrate and to preferentially adhere to the subsequently applied layers. To do this the bond of the release layer to the next applied layer must be stronger than the bond of the release layer to the substrate.

The above result can be generally attained by utilizing release materials having essentially low surface energies but still bondable to the color layer. In addition, this coating must be insoluble in the solvents utilized in coating the image layer. It is essential for the successful use of the release layer in this case for failure of the release layer/substrate bond to occur. Modifiers of the release film to adjust the bond strength of the release coat to the color coat typically are water soluble polymers with more hydrophobic properties than the release polymer itself. Such modifiers may be determined by the skilled artisan using routine experimental techniques.

In the preferred embodiment, the dried release layer comprises both polyvinyl alcohol and polyvinyl pyrrolidone. The preferred concentration of the polyvinyl alcohol in this dry film is in the range of from about 69% to about 88% by weight and the preferred concentration of the polyvinyl alcohol in this dried film ranges from about 22% to about 39% by weight. Preferred polyvinyl alcohols include Gelva polyvinyl alcohol 20/30 available from Monsanto. Preferred polyvinyl pyrrolidones include polyvinyl pyrrolidone K-60 and K-30 (available from G.A.F.).

One preferred coating formulation, for this layer, is as follows:

| Component | Wt. % |
|---|---|
| Gelva polyvinyl alcohol 20/30 | 3.174 ± .5 |
| Polyvinyl pyrrolidone K-60 M.W. —160,000 (45% aq. solution) | .871 ± .2 |
| Polyvinyl pyrrolidone K-30 M.W. —40,000 | .522 ± .15 |
| Ethanol | 20.091 ± 5.0 |
| Water | 75.342 ± 5.0 |
| | 100.000 |

The colored photosensitive layer is the next layer coated and is preferably applied from an organic solvent coating composition. It may then be applied to the water soluble release coat without fear of intrasolvating the components of the release layer and color layer. Organic solvents are preferred for the color coating because of the diverse solubility characteristics of the color coat components.

A typical photosensitive layer comprises a photopolymerizable monomer component, a photoinitiator, a binder, colorants and fillers.

The photopolymerizable material contained in the color layer comprises an addition polymerizable, non-gaseous (boiling temperature above 100° C. at normal atmospheric pressure), ethylenically-unsaturated compounds containing at least two terminal ethylenic groups, and being capable of forming a high molecular weight polymer by free radical initiated, chain propagating addition polymerization. Suitable polymerizable materials non-exclusively include polybutane diol diacrylate, tetraethylene glycol dimethacrylate, ethylene glycol dimethacrylate, trimethylol propane timethyacrylate, trimethylol propane triacrylate, polyethylene glycol (200) diacrylate, diethylene glycol dimethacrylate, pentaerythritoltetraacrylate, dicyclopentenyl acrylate, dicyclopentenyl methacrylate, 1,4 butanediol diacrylate, 1,6, hexanediol dimethacrylate, dipentaerythritol monohydroxypentaacrylate, ethoxylate bisphenol a dimethacrylate, and tripropylene glycol diacrylate.

Free radical liberating photoinitiators include any compound which liberates free radicals on stimulation by actinic radiation. Preferred photoinitiators non-exclusively include p-methoxy phenyl quinoxalin, 9-phenyl acridine, the vicinal poly ketaldonyl compounds described in U.S. Pat. No. 2,367,660; the alpha-carbonyls described in U.S. Pat. No. 2,367,661 and 2,367,670; the acyloin ethers described in U.S. Pat. No. 2,448,828, the triarylimidazolyl dimer/p-amino-phenyl ketone combination described in U.S. Pat. No. 3,549,367 and the dye sensitized photolyzable organic halogen compounds described in U.S. Pat. No. 3,640,718 and 3,617,288.

Pigments or dyes may be typically included in the photosensitive layers to provide color to the image areas.

Image coloration is generally desirable for registration and is particularly important for image transfer.

Preferred colorants for this invention are pigments rather than dyes. They are dispersed in a small amount of polymethyl methacrylate/methacrylic acid (85/15) vehicle and methyl ethyl ketone solvent. The pigment particles are ground to a small enough particle size to duplicate the particle size and color of equivalent inks.

The preferred pigment dispersions are as follows:

TABLE 1

| Pigment | Cyan Composition Weight % | Magneta Blue Composition Weight % | Magenta Red Composition Weight % | Quinacridone Red Weight % | Yellow Composition Weight % | Black Composition Weight % |
|---|---|---|---|---|---|---|
| Phthalo cyanine Blue (B-115/3) CI 74160 | 10.0 | | | | | |
| Rhodamine Red CI 45160 | | 7.0 | | | | |
| Quinacridone Red CI 46500 | | | | 7.0 | | |
| Bon Red Yellow Shade CI 15865/1 | | | 7.0 | | | |
| Diarylide Yellow (American Hoechst Corp.) | | | | | 5.0 | |
| Carbon Furnace Black (BK-6) CI 77266 | | | | | | 4.5 |
| Polymethyl methacrylate/ methacrylic acid (85/15) | 26.3 | 26.3 | 26.3 | | 26.3 | 28.1 |
| Methyl ethyl ketone solvent | 63.7 | 66.7 | 66.7 | | 68.7 | 67.5 |

Additional non-exclusive examples of colorants usable in the present invention are as follows: Benzidine Yellow G (C.I. 21090), Benzidine Yellow GR (C.I. 21100), Permanent Yellow DHG (product of Hoechst AG), Brilliant Carmine 6B (C.I. 15850), Rhodamine 6G Lake (C.I. 45160), Rhodamine B Lake (C.I. 45170), Phthalocyanine Blue non crystal (C.I. 74160), Phthalocyanine Green (C.I. 74260), Carbon Black, Fat Yellow 5G, Fat Yellow 3G, Fat Red G, Fat Red HRR, Fat Red 5B, Fat Black HB, Zapon Fast Black RE, Zapon Fast Black B, Zapon Fast Blue HFL, Zapon Fast Red BB, Zapon Fast Red GE, Zapon Fast Yellow G, quinacridone Red (C.I. 46500).

The photosensitive layer also contains a binder which not only determines the hardness and or flexibility of the coating but is also used to control developability of the image. For example, if the binder is too soluble in the developer used and too little polymerizable monomer is present, the image will wash off. At the other extreme if there is too little binder and too much polymerizable monomer the layer will be soft and fluid before exposure or the exposed image areas may be too hard for efficient transfer.

Binders found suitable for this use are styrene/maleic anhydride polymers that can vary in monomer content at a ratio of from about 70/30 to about 95/5; polymethyl methacrylate/methacrylic acid copolymer having a ratio of monomers ranging from about 70/30 to 95/5; polymethyl methacrylate/ethyl acrylate/methacrylic acid copolymer having a ratio of monomers ranging from about 50/30/20 to about 90/5/5; polymethyl methacrylate/butyl acrylate/methacrylic acid copolymer having a ratio of monomers ranging from about 50/30/20 to about 90/5/5. Binders with no acid value but with the solubility characteristics to develop properly in the alkaline aqueous developers useful for the invention. Examples of this type of binder system non-exclusively include polyvinyl pyrrolidone polymers K-60 and K-90 (G.A.F.), hydroxypropyl cellulose, methyl cellulose, and ethyl hydroxy ethyl cellulose polymers.

In the practice of the present invention the photopolymerizable monomer component is preferably present in the photosensitive layer in an amount ranging from about 18% to about 40.0% based on the weight of the solids in the layer. A more preferred range is from about 20.0% to about 38.0% and most preferably from about 22% to about 37.0%.

In the practice of the present invention the photoinitiator component is preferably present in the photosensitive layer in an amount ranging from about 2.0% to about 10.0% based on the weight of the solids in the layer. A more preferred range is from about 3.0% to about 8.0% and most preferably from about 3.5% to about 7.0%.

In the practice of the present invention the colorant component is preferably present in the photosensitive layer in an amount ranging from about 3.0% to about 9.0% based on the weight of the solids in the layer. A more preferred range is from about 4.5% to about 8.5% and most preferably from about 4.0% to about 8.0%.

In the practice of the present invention the binder component is preferably present in the photosensitive layer in an amount ranging from about 18.0% to about 40.0% based on the weight of the solids in the layer. A more preferred range is from about 20.0% to about 38.0% and most preferably from about 22.0% to about 33.0%.

The photosensitive layer ingredients are dispersed in a suitable solvent composition, coated, and dried of the coating solvents. Typical solvents non-exclusively include methyl ethyl ketone, methyl Cellosolve and butyrolactone. The photosensitive layer may also include such optional materials as surfactants and inert fillers.

The following photosensitive layer compositions are preferred:

| Component | Cyan % weight | Magenta % weight | Yellow % weight | Black % weight |
|---|---|---|---|---|
| Cyan Dispersion | 8.95 | | | |
| Yellow Dispersion | | | 24.53 | |
| Magenta Blue Dispersion | | | | |
| Magenta Red Dispersion | | | | |
| Black Dispersion | | | | 18.15 |
| Methyl ethyl ketone | 37.10 | 32.29 | 28.90 | 31.45 |
| Methyl Cellosolve | 37.10 | 32.29 | 28.90 | 31.45 |
| Butyrotactone | 3.87 | 7.82 | 7.73 | 7.29 |
| Polymethyl methacrylate/methacrylic Acid 85/15 | 2.88 | .94 | | 2.19 |
| Polymethyl methacrylate/methacrylic Acid 95/5 | 3.71 | 3.26 | 3.37 | 3.14 |
| Polybutane diol diacrylate | 4.15 | 4.56 | 4.33 | 4.23 |
| Byk 301* (1.5% solution in methyl Cellosolve) | .64 | .65 | .64 | .60 |
| p-methoxy phenyl quinoxalin initiator | .96 | .98 | .96 | .90 |
| 9-phenyl acridine initiator | .64 | .65 | .64 | .60 |

*Polyglycol siloxane surfactant available from Byk/Mallinckrodt, Melville, New York The adhesive layer is next applied to the photosensitive layer. Its purpose is to aid in the transfer of the coating composite and to protect consecutive proofing colors from overdevelopment. Therefore, it is preferred to use a water dispersable resin which will not intra-solubilize with components from the photosensitive layer when it is applied and will not be solubilized by the alkaline developer in the dry state. In one preferred embodiment the adhesive composition is a dispersed aqueous mixture of a polymeric component.

Polyvinyl acetate adhesives are preferred for this purpose. The adhesive film is activated with heat and, it is preferred, for this lamination transfer process, to use the adhesive with an activation temperature that is safely below that temperature that will cause shrinkage in the base substrate.

In another preferred embodiment, the adhesive layer also contains a plasticizer component. Suitable plasticizers include phthalates, non-exclusively including dibutyl phthalate, butyl benzyl phthalate and dimethyl phthalate. Other suitable plasticizers may be readily determined by the skilled artisan. The preferred adhesive formulation for this process is as follows:

| Component | Wt. % Coating | Wt. % Dry Film |
|---|---|---|
| Gelva TS-85 (Monsanto) (55% solids) polyvinyl acetate | 31.38 | 60.24 ± 5.0 |
| Mowilith DM-22 (American Hoechst) (55% solids) -polyvinyl acetate | 20.20 | 38.77 ± 5.0 |
| Santicizer S-160 - Butyl benzyl phthalate (Monsanto) | .51 | 1.0 ± .2 |
| Water | 47.91 | |

Other polymeric water dispersions that may be used are acrylic polymers, copolymers, or terpolymers, vinyl copolymers and terpolymers, and other vinyl acetate copolymers and terpolymers or further polymeric variations of these polymers that produce a softening temperature between about 150° and 180° F.

In the practice of the present invention the polymeric component is preferably present in the adhesive layer in an amount ranging from about 55.0% to about 65.0% based on the weight of the solids in the layer. A more preferred range is from about 57.0% to about 63.0% and most preferably from about 58.0% to about 62.0%.

In the practice of the present invention the plasticizer component is preferably present in the adhesive layer in an amount ranging from about 0.7% to about 1.2% based on the weight of the solids in the layer. A more preferred range is from about 0.8% to about 1.1% and most preferably from about 0.85% to about 1.0%.

In operation, the photographic element is capable of producing a color proofing member by each of two alternate processes.

In one process, the photosensitive element is laminated to a receptor sheet via the adhesive layer by first transferring the adhesive, photosensitive and release layers to one side of the receptor sheet. The supporting substrate is then peeled away, usually manually. The photosensitive layer is then imagewise exposed to actinic radiation. The release layer and the unexposed areas of the colored photosensitive layer are then dissolved away with a wet developer thus leaving a colored image disposed on the receptor sheet. Each of these steps is then repeated at least once for a different color whereby the image of the next colored photosensitive element is applied over the first colored image on the same side of the receptor sheet.

In the second alternative process, a colored photosensitive layer of the photosensitive element is first imagewise exposed to actinic radiation. The exposed photosensitive element with its latent image is attached to a temporary receiving sheet by laminating the element to a temporary receiving sheet. The adhesive, photosensitive and release layers on the substrate transferring to one side of the temporary receiving sheet. The substrate is then peeled away. Then substantially all of the release layer and the unexposed portion of the colored photosensitive layer are removed with a wet developer thus leaving a colored image on the adhesive and temporary receiving sheet. This image and adhesive composite is then laminated to a receptor sheet and the temporary receiving sheet is then peeled away. Each of these steps is then repeated for at least one different color whereby the additional color(s) is carried on the same side of the same receptor sheet.

Lamination may be conducted by putting the receiver sheet in contact with the coated side of the colored photosensitive element and then introducing the two materials into the nip of a pair of heated laminating rollers under suitable pressure. Suitable laminating temperatures usually range from about 60° C. to about 90° C., preferably about 75° C. to about 85° C. After lamination, the substrate or temporary receiver sheet, as the case may be, is peeled away, usually merely employing manual peeling forces.

The photosensitive layer is imagewise exposed by means well known in the art either before or after lamination. Such exposure may be conducted by exposure to a uv light source through a photomask under vacuum frame conditions. Exposure may be performed with actinic light through a conventional negtive flat. Exposures after lamination and peel apart are preferred for emulsion-to-emulsion contact. Mercury vapor discharge lamps are preferred to metal halide lamps. Filters may be used to reduce light scattering in the material.

After exposure, the photosensitive layer is developed by dissolving the non-exposed area in a suitable wet developer and dried. The adhesive layer is not removed by this development. One suitable developer is:

| Water | 88.5% |
|---|---|
| Monosodium phosphate | .5% |
| Trisodium phosphate | 2.5% |
| Sodium sulfate derivative of 7-ethyl-2-methyl, 4 undecanol | 8.5% |

Any developer solution which satisfactorily removes the non-exposed areas of the photosensitive layer after exposure while retaining the image areas may be used. The selection of developer is well within the ability of the skilled artisan. The preferred developer is an aqueous alkaline solution.

In the usual case, four colored layers are employed to produce a full color reproduction of a desired image. These are cyan, magenta, yellow and black.

The following non-limiting examples serve to illustrate the invention.

EXAMPLE 1

A release composition is prepared by mixing:

| wt. % | |
|---|---|
| 1.5 Kgs. | Gelvatol 20/30 Polyvinyl alcohol resin (Monsanto) |
| 30.0 Kgs. | Deionized water |
| 15.0 Kgs. | Ethanol |

The polymer is dissolved in the water first and then the ethanol is added. The resulting clear solution is coated onto a 3 mil transparent polyester base substrate and dried at 150° F. for 1 minute to provide a coating weight of 0.87 gms/m$^2$.

A photosensitive composition is prepared by dissolving the following components with moderate stirring:

| 5.1 Kgs. | Polymethyl methacrylate/methacrylic acid 85/15 - 36% soln. in methyl ethyl ketone (30,000 M. W.) |
|---|---|
| 1.5 Kgs. | Trimethylol propane triacrylate |
| .075 Kgs. | Victoria Pure Blue FGA dye (BASF) |
| .005 Kg. | Calcozine Yellow SFW dye (Am. Cyanamid) |
| .150 Kgs. | 9-phenyl Acridine initiator |
| 9.0 Kgs. | Methyl ethyl ketone |
| 9.0 Kgs. | Methyl Cellosolve |

The photosensitive solution is coated on the dry release layer and dried at 150° F. to provide a dry coating weight of 1.5±0.5 gms/m$^2$.

An adhesive coating solution is prepared by mixing

| 15.0 Kgs. | TS-85 Polyvinyl Acetate adhesive 55% solids - Monsanto |
|---|---|
| 3.0 Kgs. | Deionized water |

The solution coat is machine coated onto the dry photosensitive layer at a coating weight of 5 gms/m$^2$.

The sheet composite is transferred to an adhesion promoted polyester film by means of a roll laminator.

After laminating the composite is cooled and the temporary carrier stripped away. In this instance transfer occurred due to failure of the release layer at the release layer/temporary carrier boundary.

The transferred film is exposed through a right reading negative for 40 seconds in a Berkey Ascor exposure unit.

The exposed composite is placed in a development sink with the coated side up. A developer solution of an aqueous alkaline developer composition is liberally poured on the sheet and the sheet allowed to soak for 20 seconds. Image development is accomplished by gently rubbing the wet sheet with a soft cotton pad for 40 seconds whereupon the unexposed areas are removed leaving the desired image.

EXAMPLE 2

A release formulation is prepared as in Example 1 which contains

| 1.0 Kg | Gelvatol 20/60 - Monsanto |
|---|---|
| 20.0 Kgs. | Deionized water |
| 10.0 Kgs. | Ethanol | and reverse roll coated onto a polyester film, as in Example 1, to provide a coating weight of 0.85 gms/m².

A photosensitive composition is prepared by dissolving the following components with moderate stirring, as in Example 1:

| 5.1 Kgs. | p-methyl methacrylate/methacrylic Acid 85/15 - 36% solids in methyl ethyl ketone (30,000 M.W.) (Rel. Visc. in ethyl Cellosolve 10% cm of 3.4) |
|---|---|
| 1.5 Kgs. | Trimethylol propane triacrylate |
| .002 Kgs. | Victoria Pure Blue FGA - BASF |
| .110 Kgs. | Rhodamine 6 GDN - BASF |
| .075 Kgs. | Rhodamine FG - BASF |
| .035 Kgs. | Calcozine Yellow SFW - Am. Cy. |
| .170 Kgs. | 9-phenyl Acridine initiator |

The photosensitive solution is whirler coated on the dry release layer as in example 1 and dried for 1.3 minutes at 150° F.±5° F. to provide a dry coating weight of 1.3 gms/m².

A top coat solution was prepared by dissolving, with moderate mixing, the following components:

| 1.6 Kgs. | Mowilith 25 (Polyvinyl acetate adhesive - 55% solids in water) |
|---|---|
| 25 Kgs. | T-butanol |
| 6.2 Kgs. | Deionized water. |

The solution is reverse roll coated onto the photosensitive layer at a coating weight of 4.5 gms/m².

The composite sheet is transferred as a solid color and as an image as in example 1.

Other primary colors may be transferred, in succession, on top of this cyan color and exposed and developed in a similar fashion ultimately producing a four color proof.

If it is desired to transfer images rather than solid color. The composite (adhesive layer/color layer/release layer) may be exposed in register and transferred to an adhesion promoted polyester sheet. The image (wrong reading) is developed, as previously described, and may be examined for defects before transferring to another preferred base (for example paper-that may be used for the actual press run.) Again, the temporary carrier is removed after image transfer.

The rest of the primary colors are exposed, transferred, developed, examined for defects, and may then be sequentially transferred in a similar manner.

EXAMPLE 3

A release composition is prepared by solubilizing the following components with moderate stirring:

| 1.41 Kgs. | Gelvatol 20/30 polyvinyl alcohol - Monsanto |
|---|---|
| .168 Kgs. | Gelvatol 20/90 polyvinyl alcohol - Monsanto |
| 33.75 Kgs. | Deionized water |
| 9.39 Kgs. | Ethanol |

It is preferred to solubilize the Gelvatol resins in the water first and then to add the ethanol.

Two different magenta mill bases are prepared by milling the following components:

| 1 | 2 | |
|---|---|---|
| | 700.0 gms | Bon Red Yellow Shade (R-48/1) C.I. - 15865/1 |
| 700.0 gms | | Rhodamine Red (R-81) (C.I. 45160) |
| 2630.0 | 2630 gms | p-methyl methacrylate/methacrylic acid (85/15) 36% solids in methyl ethyl ketone |
| 6670.0 | 6670 gms | Methyl ethyl ketone |

Equal parts of these mill bases are added to the following light sensitive composition, with moderate stirring, as in Example 1:

| 1.27 Kgs. | No. 2 dispersion |
|---|---|
| 1.27 Kgs. | No. 1 dispersion |
| .145 Kgs. | polymethyl methacrylate/methacrylic acid - 85/15 (100% solids - Esschem) |
| .500 Kgs. | polymethyl methacrylate/methacrylic acid - 95/5 (100% solids - Esschem) |
| .700 Kgs. | poly butane diol diacrylate - Alcolac |
| .100 Kgs | Byk 301 solution - silicone resin - Byk - Mallinckrodt (.5% soln. in methyl Cellosolve) |
| .100 Kgs | 9-phenyl acridine |
| 4.95 Kgs. | methyl cellosolve |
| 4.95 Kgs. | methyl ethyl ketone |
| 1.20 Kgs. | butyrolactone |

The photosensitive dispersion is three roll reverse coated on the dry release layer as in example 1 and dried for 1.0 minute at 150° F. to provide a dry coating weight of 1.5 gms/m².

A top coat solution is prepared by mixing the following components at ambient temperatures till homogeneously dissolved:

| 7.3 Kgs. | TS-85 polyvinyl acetate emulsion (55% solids - 30,000 MW) Monsanto |
|---|---|
| 4.7 Kgs. | Mowilith DM-22 polyvinyl acetate (55% solids - 20,000 MW) - Hoechst |
| .012 Kgs. | Santicizer 160 (butyl benzyl phthalate) |
| 11.25 Kgs. | Deionized Water |

The solution is reverse roll coated onto the photosensitive layer at a coating weight of 5.2 gms/m².

The composite is transferred to an adhesion promoted while polyester film base with a roll laminator as in Example 1 and developed in a color proofing processor at 80° F.

EXAMPLE 4

A release composition is prepared by solubilizing the following components with moderate stirring:

| .948 Kgs. | Gelvatol 20/30 |
|---|---|
| .260 Kgs. | polyvinylpyrrolidone K-60 (GAF) |
| .156 Kgs. | polyvinylpyrrolidone K-30 (GAF) |
| 6.0 Kgs. | Ethanol |

| 22.5 Kgs. | Deionized water |

The solution is reverse roll coated onto untreated polyester film, as in Example 1, to provide a coating weight of 0.80 gms/m².

A yellow mill base is prepared by milling the following components.

| 500.0 gms | Diarylide Yellow (American Hoechst Corp.) |
| 2630.0 gms | p-methyl methacrylate/methacrylic acid - 85/15 |
| 6879.0 gms | Methyl ethyl ketone |

The mill base is added to the light sensitive formulation, with moderate stirring, and according to the following formulation:

| 3.82 Kgs. | Yellow dispersion |
| .525 Kgs. | poly methyl methacrylate/methacrylic acid - 85/15 |
| .600 Kgs. | poly butane diol diacrylate |
| .150 Kgs. | 2,3 di-p-methoxy phenyl quinoxalin 1,4 |
| .100 Kgs. | 9-phenyl acridine |
| 4.500 Kgs. | Methyl ethyl ketone |
| 1.200 Kgs. | Butyralactone |
| .100 Kgs. | Byk 301 (.5% in Methyl Cellosolve) |

The photosensitive dispersion is three roll reverse coated on the dry release layer, as in Example 1, and dried for 1.0 minute at 150° F. to provide a dry coating weight of 1.43 gms/m².

An adhesive solution is prepared, as in Example 1, and three roll reverse coated onto the photosensitive layer at a coating weight of 4.5 gms/m².

The resulting composite is transferred as a solid color and as an image as in Example 3.

EXAMPLE 5

A release composition is prepared by solubulizing the following components with moderate stirring:

| 1.4 Kgs. | Gelvatol 20/30 polyvinylpyrrolidone K-90 (GAF) |
| 33.75 Kgs. | deionized water |
| 9.39 Kgs. | ethanol |

The solution is reverse roll coated onto untreated polyester film, as in Example 1, to provide a coating weight of 0.85 gms/m².

A black mill base is prepared by milling the following components:

| 450.0 gms | Furnace Black BK-6 C.I. - 77266 |
| 2800.0 gms | polymethyl methacrylate/methacrylic acid (85/15) (30,000 MW) |
| 6750.0 gms | Methylethyl ketone |

The following light sensitive formulation is added to a portion of the mill base with moderate stirring:

| .0181 Kg. | Furnace Black dispersion |
| .363 Kgs. | poly methyl methacrylate/methacrylic acid (85/15) |
| .520 Kgs. | poly methyl methacrylate/methacrylic acid (95/5) |
| .600 Kgs. | poly butanediol diacrylate |
| .100 Kgs. | Byk 301 Solution - Silicone Resin by Byk - Mallinckrodt (.5% solution in methyl Cellosolve) |
| .125 Kgs. | 2,3 di-p-methoxy phenyl quinoxalin 1,4 |
| .050 Kgs. | 9-phenyl acridine |
| 5.20 Kgs. | Methyl Cellosolve |
| 5.20 Kgs. | Methyl ethyl ketone |
| 1.20 Kgs. | Butyrolatone |

The photosensitive dispersion is three roll reverse coated on the dry release layers, as in Example 1, dried for 1.0 minutes at 150° F. to provide a dry coating weight of 1.5 gms/m².

An adhesive solution is prepared by mixing the following components, at ambient temperatures, until homogeneous:

| 10.0 Kgs. | TS-85 p Vinyl Acetate Emulsion (55% solids) - Monsanto |
| 5.5 Kgs. | Mowilith DM-22 - Hoechst |
| .030 Kgs. | Santicizer 160 |
| 15.0 Kgs. | Deionized Water |

The solution is reverse roll coated onto the photosensitive layer at a coating weight of 4.6 gms/m².

The resulting composite is transferred as a solid color and as an image as in Example 3.

EXAMPLE 6

A release composition is prepared as in Example 4 and reverse roll coated onto untreated polyester film to provide a coating weight of 0.87 gm/m².

A cyan dispersion is prepared by milling the following components:

| 1000.0 gms | Phthalocyanine Blue (B-115/3) |
| 2630.0 gms | p-methyl methacrylate/methacrylic acid - (85/15) 30% solids |
| 6370.0 gms | methyl ethyl ketone |

The following light sensitive formulation is added to a portion of the mill base with moderate stirring:

| 2.40 Kgs. | Cyan dispersion given above |
| .8 Kgs. | p-methyl methacrylate/methacrylic acid - 85/15 (100% solids) |
| .2 Kgs. | polymethyl methacrylate/methacrylic acid 95/5 (100% solids) |
| 1.0 Kg | poly propylene glycol diacrylate M. W. - 556 |
| .2 Kgs | 2,3 di-p-methoxy phenol quinoxalin 1,4 |
| 7.0 Kgs. | methyl ethyl ketone |
| 7.0 Kgs. | methyl cellosslve |
| 1.4 Kgs. | butyrolactone |

The photosensitive dispersion is three roll reverse coated on the dry release layer, as in Example 1, and dried for 1 minute at 150° F. to provide a coating weight of 1.4 gms/m².

An adhesion solution is prepared by mixing the following components, at ambient temperatures until homogeneous:

| 15.0 Kgs. | TS-85 polyvinyl acetate emulsion 55% solids - Monsanto |

| 5.2 Kgs. | Deionized Water |

The solution is reverse roll coated onto the photosensitive layer at a coating weight of 5.7 gms/m$^2$.

The resulting composite is transferred as a solid color and as an image as in Example 1.

EXAMPLE 7

A release composition is prepared by mixing with moderate stirring to a homogeneous solution:

| 1.0 Kg. | Gelvatol 20/30 |
| 30. Kgs. | Deionized Water |

This solution is reverse roll coated on the untreated polyester base to provide a coating weight of 0.90 gms/m$^2$.

The following light sensitive formulation is prepared by solubilizing the following components into a homogeneous solution:

| 1.095 | p-methyl methacrylate/methacrylic acid 85/15 100% solids |
| .365 Kgs. | p-methyl methacrylate/methacrylic acid 95/5 100% solids |
| 1.2 Kgs. | tetraethylene glycol dimethacrylate |
| .074 Kgs. | Rhodamine 6GDN |
| .050 Kgs. | Rhodamine FB |
| .020 Kgs. | Calcozine Yellow SFW |
| .001 Kgs. | Victoria Pure Blue FGA |
| .160 Kgs. | 9-phenyl acridiene |
| 6.06 Kgs. | Methyl ethyl ketone |
| 6.06 Kgs. | Methyl Cellosolve |

The photosensitive solution is three roll reverse coated on the dry release layer, as in Example 1, and dried for 1 minute at 150° F. to provide a dry coating weight of 1.0 gm./m$^2$.

An adhesive solution is prepared as in Example 3 and is reverse roll coated onto the photosensitive layer at a coating weight of 5.0 gms/m$^2$.

Both solid color transfers and image transfers are made from this composite as in Example 1.

What is claimed is:

1. A method for producing a multi-colored proofing member which comprises
   (a) providing a colored photographic element which comprises a substrate having sequentially disposed thereon a release layer; a colored, photopolymerizable, photosensitive layer; and an adhesive layer; said element being capable of alternatively undergoing each of the functions (1) and (2) below; and
   (b) performing either function 1 or function 2:
      (1) laminating said element to a receptor sheet by transferring said adhesive, colored photosensitive and release layers to one side of said receptor sheet, and peeling off said substrate; imagewise exposing said colored layer to actinic radiation; removing said release layer and the unexposed areas of said colored photosensitive layer with a wet developer and leaving a colored image disposed on said receptor sheet; and repeating the foregoing steps of function (1) for at least one different colored photographic element wherein each of said different colored images is carried on the same side of said receptor sheet;
      (2) exposing said colored photosensitive layer to actinic radiation; laminating said element to a temporary receiving sheet by transferring said adhesive, colored photosensitive and release layers to one side of said temporary receiving sheet and peeling off said substrate; removing substantially all of said release layer and the unexposed areas of said colored layer with a wet developer while leaving a colored image disposed on said temporary receiving sheet and laminating said adhesive layer and said colored image to a receptor sheet and peeling off said temporary receiving sheet; and repeating the foregoing steps of function (2) for at least one different colored photographic element wherein each of said different colored images is carried on the same side of said receptor sheet.

2. The method of claim 1 wherein said substrate comprises polyethylene terephthalate.

3. The method of claim 1 wherein said release layer comprises one or more compounds selected from the group consisting of polyvinyl alcohol and polyvinyl pyrrolidone.

4. The method of claim 1 wherein said photosensitive layer comprises one or more compounds selected from the group consisting of polybutane diol diacrylate, tetraethylene glycol dimethacrylate, ethylene glycol dimethacrylate, trimethylol propane trimethyacrylate, trimethylol propane triacrylate, polyethylene glycol (200) diacrylate, diethylene glycol dimethacrylate, pentaerythritol tetraacrylate, dicyclopentenyl acrylate, dicyclopentenyl methacrylate, 1,4 butanediol diacrylate, 1,6, hexanediol dimethacrylate, dipentaerythritol monohydroxypentaacrylate, ethoxylated bisphenol A dimethacrylate, and tripropylene glycol diacrylate.

5. The method of claim 1 wherein said photosensitive layer comprises one or more photoinitiators selected from the group consisting of p-methoxy phenyl quinoxalin and 9-phenyl acridine.

6. The method of claim 1 wherein said photosensitive layer comprises one or more colorants selected from the group consisting of dyes and pigments.

7. The method of claim 1 wherein said photosensitive layer comprises one or more binders selected from the group consisting of styrene/maleic anhydride copolymer; polymethyl methacrylate/methacrylic acid copolymer; polymethyl methacrylate/ethyl acrylate/methacrylic acid copolymer; and polymethyl methacrylate/butyl acrylate/methacrylic acid copolymer.

8. The method of claim 1 wherein said adhesive layer comprises one or more water dispersible polymers having a softening temperature in the range of from about 150° F. and 180° F.

9. The method of claim 1 wherein said adhesive layer further comprises a polyvinyl acetate.

10. The method of claim 8 wherein said adhesive layer further comprises a plasticizer.

11. The method of claim 9 wherein said adhesive layer further comprises a plasticizer.

12. The method of claim 11 wherein said plasticizer is a phthalate.

13. The method of claim 12 wherein said plasticizer comprises one or more compounds selected from the group consisting of dibutyl phthalate, butyl benzyl phthalate and dimethyl phthalate.

14. The method of claim 1 wherein said developer comprises an aqueous alkaline solution.

15. The method of claim 1 wherein (a) said substrate comprises polyethylene terephthalate; and
(b) said release layer comprises one or more compounds selected from the group consisting of polyvinyl alcohol and polyvinyl pyrrolidone; and
(c) said photosensitive layer comprises one or more compounds selected from the group consisting of polybutane diol diacrylate, tetraethylene glycol dimethacrylate, ethylene glycol dimethacrylate, trimethylol propane trimethacrylate, trimethylol propane triacrylate, polyethylene glycol (200) diacrylate, diethylene glycol dimethacrylate, pentaerythritol tetraacrylate, dicyclopentenyl acrylate, dicyclopentenyl methacrylate, 1,4 butanediol diacrylate, 1,6, hexanediol dimethacrylate, dipentaerythritol monohydroxypentaacrylate, ethoxylated bisphenol A dimethacrylate, and tripropylene glycol diacrylate; and
(d) said photosensitive layer further comprises one or more photoinitiators selected from the group consisting of p-methoxy phenyl quinoxalin and 9-phenyl acridine; and
(e) said photosensitive layer further comprises one or more colorants selected from the group consisting of dyes and pigments; and
(f) said photosensitive layer further comprises one or more binders selected from the group consisting of styrene/maleic anhydride copolymer; polymethyl methacrylate/methacrylic acid copolymer; polymethyl methacrylate/ethyl acrylate/methacrylic acid copolymer; and polymethyl methacrylate/butyl acrylate/methacrylic acid copolymers, and
(g) said adhesive layer comprises polyvinyl acetate.

16. The method of claim 15 wherein said adhesive layer further comprises a plasticizer.

17. A method for producing a multi-colored proofing memeber which comprises
(a) providing a colored photographic element which comprises a substrate having sequentially disposed thereon a release layer; a colored, photopolymerizable, photosensitive layer; and an adhesive layer; said element being capable of alternatively undergoing each of the functions (1) and (2) below; and
(b) performing either function 1 or function 2:
  (1) laminating said element to a receptor sheet by transferring said adhesive, colored photosensitive and release layers to one side of said receptor sheet, and peeling off said substrate; imagewise exposing said colored layer to actinic radiation; removing said release layer and the unexposed areas of said colored photosensitive layer with a wet developer and leaving a colored image disposed on said receptor sheet; and repeating the foregoing steps of function (1) for at least one different colored photographic element wherein each of said different colored images is carried on the same side of said receptor sheet;
  (2) exposing said colored photosensitive layer to actinic radiation; laminating said element to a temporary receiving sheet by transferring said adhesive, colored photosensitive and release layers to one side of said temporary receiving sheet and peeling off said substrate; removing substantially all of said release layer and the unexposed areas of said colored layer with a wet developer while leaving a colored image disposed on said temporary receiving sheet and laminating said adhesive layer and said colored image to a receptor sheet and peeling off said temporary receiving sheet; and repeating the foregoing steps of function (2) for at least one different colored photographic element wherein each of said different colored images is carried on the same side of said receptor sheet; wherein the photosensitive layer comprises a colorant; and an addition polymerizable, non-gaseous ethylenically-unsaturated compound containing at least two terminal ethylenic groups, having a boiling temperature above 100° C. at normal atmospheric pressure and being capable of forming a high molecular weight polymer by free radical initiated, chain propagating addition polymerization; and a photoinitiator which liberates free radicals on stimulation by actinic radiation.

* * * * *